United States Patent
Hagmanns (10) Patent No.: US 7,812,748 B2
(45) Date of Patent: Oct. 12, 2010

(54) APPARATUS FOR MONITORING NON-LINEAR DISTORTIONS OF RADIO SIGNALS AND A METHOD THEREFOR

(75) Inventor: Franz-Josef Hagmanns, Backnang (DE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 88 days.

(21) Appl. No.: 12/301,909

(22) PCT Filed: May 22, 2006

(86) PCT No.: PCT/EP2006/062489
§ 371 (c)(1), (2), (4) Date: Jan. 19, 2009

(87) PCT Pub. No.: WO2007/134637
PCT Pub. Date: Nov. 29, 2007

(65) Prior Publication Data
US 2010/0134333 A1  Jun. 3, 2010

(51) Int. Cl.
*H03M 1/06* (2006.01)
(52) U.S. Cl. ........................ 341/118; 375/285
(58) Field of Classification Search ......... 341/115–155; 375/285, 297, 299
See application file for complete search history.

(56) References Cited

U.S. PATENT DOCUMENTS

| | | | |
|---|---|---|---|
| 6,907,085 B2* | 6/2005 | Kubo et al. | 375/285 |
| 7,295,813 B2* | 11/2007 | Haub et al. | 455/67.13 |
| 7,555,058 B2* | 6/2009 | Hori et al. | 375/296 |
| 2001/0051504 A1 | 12/2001 | Kubo et al. | |
| 2006/0056536 A1 | 3/2006 | Hori et al. | |

FOREIGN PATENT DOCUMENTS

WO   2005/112254 A1   11/2005

* cited by examiner

*Primary Examiner*—Lam T Mai
(74) *Attorney, Agent, or Firm*—Coats & Bennett, P.L.L.C.

(57) ABSTRACT

A transmitter (200) for transmitting radio signals comprising a digital signal source (102), a compensation unit (104), two digital-to-analogue converters (106) and (108), an analogue modulator (110), an amplifier (112) an antenna (114) connected to the amplifier (112), the transmitter further comprises a front-end unit (220) connected to an estimator (230). Said front-end unit (220) comprises a mixer operably (302) connected to a local oscillator (304), an analogue-to-digital converter (306) for processing signal received from the mixer (302), a first digital filter (308) for converting signal received from the analogue-to-digital converter (306) to a baseband signal, an adaptive digital filter (310) operable to time-synchronise its output signal ($z(k)$) to a reference signal ($r(k)$) and to remove linear distortions from the signal received from the first digital filter.

22 Claims, 4 Drawing Sheets

APPARATUS FOR MONITORING NON-LINEAR DISTORTIONS OF RADIO SIGNALS AND A METHOD THEREFOR

FIELD OF THE INVENTION

The present invention relates to an apparatus and a method of transmitting radio signals, in general, and in particular to a front-end unit and a method for monitoring non-linear distortions of radio signals.

BACKGROUND OF THE INVENTION

Figure 1:
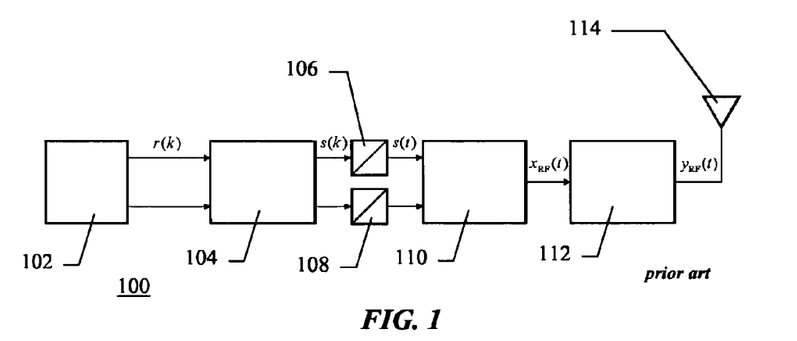
FIG. 1 is a diagram illustrating radio transmitter known in the art.

A radio transmitter 100 known in the art is illustrated in FIG. 1. It comprises a digital signal source 102, which typically generates the information bearing signals in the baseband domain, (i.e. the in-phase-signal and the quadrature-signal), a compensation unit 104 for compensating the non-linear distortions, two digital-to-analogue converters (DACs) 106, 108, one for the in-phase-signal and one for the quadrature-signal, an analogue modulator 110, to modulate the baseband signal onto a radio frequency (RF) carrier, an amplifier 112 and an antenna 114.

The modulation is often performed in two steps. In the first step the information bearing signal is modulated onto an intermediate-frequency (IF) carrier. The frequency of such a carrier is much below the radio frequency. In the second step the IF signal is converted to the radio frequency. Typically, such a configuration is used, when the bandwidth of the information bearing signal is quite large.

In other solutions known in the art, the modulation could be performed digitally, using a low IF. In these types of solutions only one DAC is required. However, the sampling frequency must be at least twice as large compared to analogue modulation. This is why digital modulation is only applicable if the bandwidth of the information bearing signals is relatively small.

Although analogue modulators can be used for wide bandwidth signals, they always suffer from imbalances. The problem with compensation of the imbalances of the modulator is that when the feedback-signal is down-converted into baseband it is impossible to distinguish between the imbalances of the transmit site modulator and the feedback part. A digital modulator, on the contrary, can be build as precise as desired. This leads to a situation that for radio signal transmitters operating on a wide bandwidth it is necessary to use analogue and imbalanced modulators and digital modulators (balanced modulation) can be used only in transmitters operating on a small bandwidth.

In order to compensate distortions introduced by the modulator and/or amplifier it is necessary to monitor the radio signal affected by these distortions.

Hence, an improved apparatus and method for monitoring non-linear distortions of radio signals would be advantageous and in particular one, which allows for monitoring that uses low rate sampling of the signal to be monitored.

SUMMARY OF THE INVENTION

Accordingly, the invention seeks to preferably mitigate, alleviate or eliminate one or more of the disadvantages mentioned above singly or in any combination.

According to a first aspect of the present invention there is provided a front-end unit for use in a radio signal transmitter comprising a mixer operably connected to a local oscillator, an analogue-to-digital converter for processing signal received from the mixer. The output of the analogue-to-digital converter is transmitted to a first digital filter, which is adapted to convert the signal received from the analogue-to-digital converter to a baseband signal and to transmit its output to an adaptive digital filter. The adaptive digital filter is operable to time-synchronise its output signal to a reference signal and to remove linear distortions from the signal received from the first digital filter.

According to a second aspect of the present invention there is provided a transmitter for transmitting radio signals. The transmitter comprises a digital signal source, a compensation unit, two digital-to-analogue converters and, an analogue modulator. The transmitter also comprises an amplifier and an antenna connected to the amplifier, and further the transmitter comprises a front-end unit connected to an estimator. Said front-end unit comprises a mixer operably connected to a local oscillator, an analogue-to-digital converter for processing signal received from the mixer. The output of the analogue-to-digital converter is transmitted to a first digital filter, which is adapted to convert the signal received from the analogue-to-digital converter to a baseband signal and to transmit its output to an adaptive digital filter. The adaptive digital filter is operable to time-synchronise its output signal to a reference signal and to remove linear distortions from the signal received from the first digital filter.

According to a third aspect of the present invention there is provided a transceiver for transmitting and receiving radio signals comprising a receiving section and a transmitting section. Said transmitting section comprises a digital signal source, a compensation unit, two digital-to-analogue converters and, an analogue modulator. The transmitter also comprises an amplifier and an antenna connected to the amplifier, and further the transmitter comprises a front-end unit connected to an estimator. Said front-end unit comprises a mixer operably connected to a local oscillator, an analogue-to-digital converter for processing signal received from the mixer. The output of the analogue-to-digital converter is transmitted to a first digital filter, which is adapted to convert the signal received from the analogue-to-digital converter to a baseband signal and to transmit its output to an adaptive digital filter. The adaptive digital filter is operable to time-synchronise its output signal to a reference signal and to remove linear distortions from the signal received from the first digital filter.

According to a fourth aspect of the present invention there is provided a method of monitoring non-linear distortions of radio signals transmitted by a radio signal transmitter. The method comprises the steps of converting radio frequency input signal to an intermediate frequency analogue signal and converting the intermediate frequency analogue signal to an intermediate frequency digital signal. In the next step the intermediate frequency digital signal is converted to a digital baseband signal. The next step comprises time-synchronisation of an output signal of an adaptive digital filter, receiving the baseband signal, to a reference signal and removal of linear distortions from the baseband signal.

Further features of the present invention are as claimed in the dependent claims.

The present invention beneficially allows for building radio transmitters for wide bandwidth signals with analogue modulators, which inherent imbalances can be effectively can be effectively compensated as a result of very precise monitoring of non-linear distortions. The present solutions, in order to monitor the non-linear distortions, allows for sampling the feedback-signal at relatively low rate. This is necessary, if IF-sampling is employed, and IF-sampling is necessary, if modulator imbalances in the transmitter part are to be compensated. The high precision of this monitoring is assured by the ability to distinguish between the imbalances of the transmit site modulator (transmit part) and the feedback site demodulator (monitoring unit).

BRIEF DESCRIPTION OF THE DRAWINGS

The present invention will be understood and appreciated more fully from the following detailed description taken in conjunction with the drawings in which.

DESCRIPTION OF AN EMBODIMENT OF THE INVENTION

Figure 2:
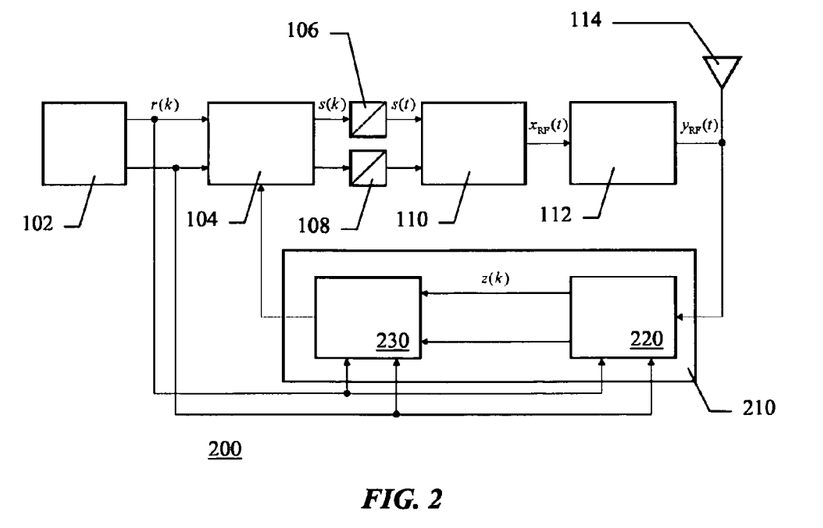
FIG. 2 is a diagram illustrating a radio transmitter in one embodiment of the present invention.

With reference to FIG. 2 a diagram illustrating a radio transmitter 200 in one embodiment of the present invention is presented. As in the solution known in the prior art the transmission path of the transmitter (or the transmitter part of a transceiver) comprises a digital signal source 102, which generates the information bearing signals in the baseband domain, (i.e. the in-phase-signal and the quadrature-signal), a compensation unit 104 for compensating the non-linear distortions, two digital-to-analogue converters (DACs) 106 and 108, one for the in-phase-signal and one for the quadrature-signal, an analogue modulator 110, to modulate the baseband signal onto a radio frequency (RF) carrier and an amplifier 112. The radio signals are transmitter via antenna 114 connected to the amplifier 112.

The compensation unit 104 is a parametric digital device; perfect compensation is only achieved, if suitable compensation-parameters are chosen. Since these parameters are dependant on the actual realisation of the modulator 110 and amplifier 112 and as such are unknown a priori, they have to be estimated. To achieve that a small portion of the information bearing signal is fed into the monitoring unit 210, which consists of a front-end unit 220 and an estimator 230.

Figure 3:
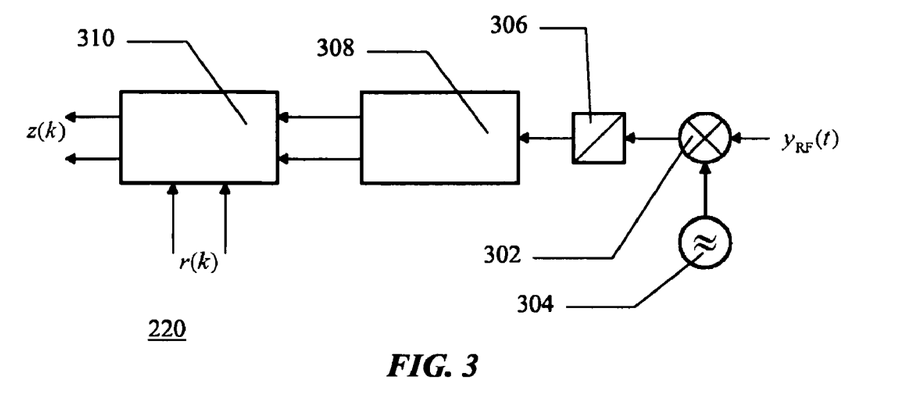
FIG. 3 is a diagram illustrating a front-end unit in one embodiment of the present invention.

One embodiment of the front-end unit 220 of the monitoring unit 210 is in details depicted in FIG. 3. In this embodiment the front-end unit 220 comprises: a mixer 302 operably connected to a local oscillator 304; an analogue-to-digital converter 306 for processing signal received from the mixer 302. It also comprises a first digital filter 308 for converting signal received from the analogue-to-digital converter 306 to a baseband signal; an adaptive digital filter 310 operable to time-synchronise its output signal $z(k)$ to a reference signal $r(k)$ and to remove linear distortions from the signal received from the first digital filter 308. An analogue filter (not shown) is placed between the mixer 302 and the analogue-to-digital converter 306. This filter is known as an anti-aliasing-filter. The anti-aliasing-filter filter is neccessary to suppress out of band noise, but in turn it introduces linear distortions to the received signal. The mixer 302 and the local oscillator 304 are adapted to convert an input radio frequency signal $y_{RF}(t)$ to an intermediate frequency signal.

In a preferred embodiment the first digital filter 308 is a digital Hilbert filter. However it is within the contemplation of the present invention that modification of the Hilbert filter design, an alternative type of filter, or other devices adapted to convert signals received from the analogue-to-digital converter 306 (digital signal in the intermediate frequency domain) into a baseband signal can also be used.

Also in a preferred embodiment the adaptive digital filter 310 is an adaptive Wiener filter. However it is within the contemplation of the present invention that modifications of the adaptive Wiener filter design, an alternative type of adaptive digital filter or other devices adapted to time-synchronise its output signal to a reference signal and to remove linear distortions from the signal received from the first digital filter can also be used.

Preferably the removal of the linear distortions is performed by minimising the mean square error between the output signal of the adaptive digital filter and the reference signal received from the signal source, but alternative methods can also be used.

The Wiener filter 310 band-limits the feedback signal $y_{RF}(t)$ to the bandwidth of the information signal $r(k)$. As a result of that, the spectral sidelobes stemming from non-linearity of the amplifier 112 are discarded, and, hence, cannot be exploited by the estimator 230. The present invention relies on the fact that, despite this property of the Wiener filter 310, all non-linear distortions remain estimable. Moreover, the band-limitation of the Wiener filter offers the opportunity to sample the feedback IF signal at relatively low rate. While non-linearity of the amplifier 112 requires a rather high sampling rate at the transmit site (usually at least five times the bandwidth of the information bearing signal), in the front-end of the monitoring unit a rate as high as two times the bandwidth of the information bearing signal suffices to sample the IF-signal. In practical implementation, the sampling rate is chosen slightly higher to ease the burden of the subsequent signal processing. Without the adaptive digital filter 310 (e.g. Wiener filter), the sampling rate had to be at least as large as two times the bandwidth of the transmitted signal $y_{RF}(t)$, which, due to the non-linearity of the amplifier 112, is around five times the bandwidth of the information bearing signal $r(k)$. The result, and great advantage of this solution, is that the use of the Wiener filter 310 offers the opportunity to sample directly the IF-signal in the monitoring unit 210. The signal is subsequently demodulated digitally by the Hilbert-Filter 308 and a baseband signal is output. As the demodulation is performed digitally, and this can be done with very high precision, there are no imbalances introduced in the monitoring unit 210. This enables the estimation and compensation of imbalances of the analogue modulator in the transmitter. When the baseband signal is processed digitally by the Wiener filter 310, the linear distortions are removed and it output a baseband $z(k)$ signal with only non-linear distortions caused by the analogue modulator 110 and the amplifier 112. Additionally, as the signal $z(k)$ is synchronised to the reference signal $r(k)$, which is also in baseband domain, it is possible for the estimator 230 to compare the two signals $z(k)$ and $r(k)$ and to provide compensation parameters to the compensation unit 104.

Figure 7:
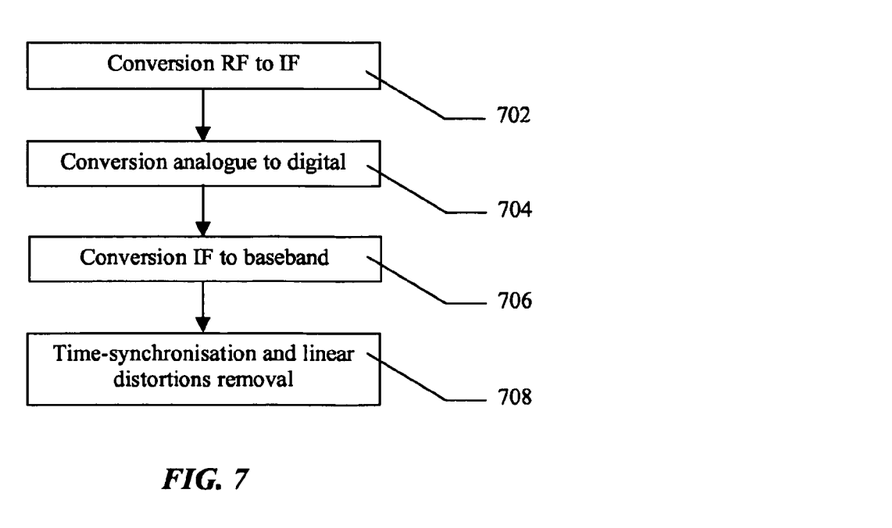
FIG. 7 is a flow-chart illustrating a method of monitoring non-linear distortions of radio signals transmitted by a radio signal transmitter in one embodiment of the present invention.

With reference to FIG. 7 one embodiment of a method of monitoring non-linear distortions of radio signals transmitted by a radio signal transmitter is presented. The method comprises a step of converting radio frequency input signal $y_{RF}(t)$ to an intermediate frequency analogue signal 702. This step is carried out by a mixer 302 and a local oscillator 304, which are part of a front-end unit 220. Input of the front-end unit 220 is connected to an output of the amplifier 112 of the radio signal transmitter 200. In the next step the analogue intermediate frequency (IF) signal is converted to a digital signal 704 (still within intermediate frequency domain) by an analogue-to-digital converter 306. A first digital filter 308 (in one embodiment it is Hilbert filter) converts in the next step 706 the IF digital signal to a baseband signal and in an adaptive digital filter 310 time-synchronisation of an output signal z(k) of the adaptive digital filter 310 to a reference signal r(k) combined with removing linear distortions from the baseband signal is performed 708. In a preferred embodiment the adaptive digital filter 310 is a Wiener filter.

In order to explain details of the present invention Table 1 presents notation of signals used in the description of the present invention and in the accompanying drawings.

TABLE 1

| Signal | Description |
| --- | --- |
| $r(k) = r_I(k) + jr_Q(k)$ | Information bearing signal, time-discrete and quantised |
| $s(k) = s_I(k) + js_Q(k)$ | Predistorted information bearing signal at the output of the compensation unit, time-discrete and quantised |
| $s(t) = s_I(t) + js_Q(t)$ | Continuous version of s(k) |
| $x_{RF}(t)$ | Modulated RF-signal |
| $y_{RF}(t)$ | Amplified RF-signal (transmit signal) |
| $y_{IF}(t)$ | Transmit signal converted to IF |
| $y_{IF}(k)$ | Sampled and quantised version of $y_{IF}(t)$ |
| $y(k) = y_I(k) + jy_Q(k)$ | Hilbert-filter output |
| $z(k) = z_I(k) + jz_Q(k)$ | Front-end output (input to the estimator) |

The following description provides detailed technical explanation of operation of the transmitter comprising the front-end unit according to the present invention.

The task of the analogue part of the transmitter is twofold: to modulate the information bearing signal onto the radio-frequency carrier and to amplify the modulated signal.

Both operations can be easily described mathematically. The information bearing signal consists of two parts, which in the following are denoted $s_I(t)$ and $s_Q(t)$. The index I stands for "Inphase", the index Q for "Quadrature". It is often helpful to view $s_I(t)$ and $s_Q(t)$ as real- and imaginary part of a complex number.

$$s(t) = s_I(t) + js_Q(t).$$

Here $j = \sqrt{-1}$ is the imaginary unit. Usually, s(t) is referred to as the baseband signal.

Modulation

Let $f_{RF}$ be the frequency of the RF-carrier and $\omega_{RF} = 2\pi f_{RF}$. Then the modulated carrier can be described as $$s_{RF}(t) = s_I(t)\cos\omega_{RF}t - s_Q(t)\sin\omega_{RF}t.$$

Figure 4:
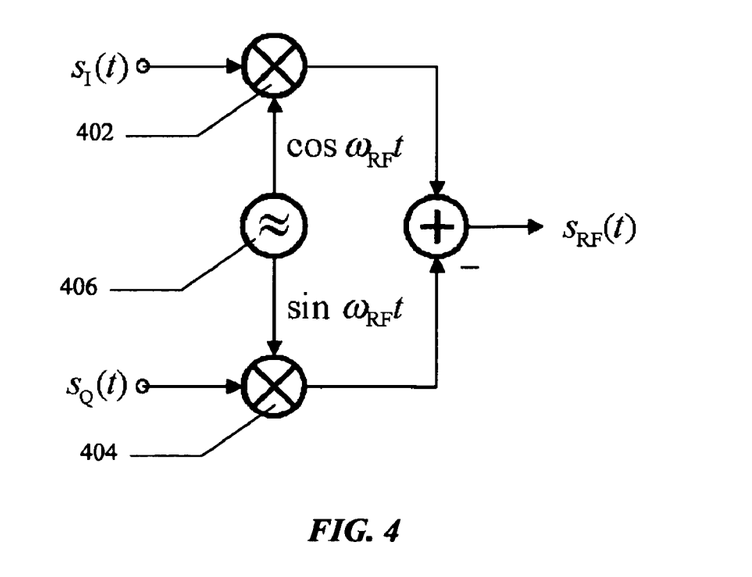
FIG. 4 is a diagram illustrating an ideal balance modulator.

FIG. 4 shows a technical realisation of this formula (i.e. ideal, balanced modulator). The modulator comprises two identical multipliers 402, 404, a local oscillator 406, which has to produce two carrier signals with equal amplitudes and with a phase difference of 90°. In practice, none of these balance-requirements can be met perfectly. Deviations from these requirements are called imbalances.

Usually imbalances grow as the carrier-frequency grows. This is why balanced modulation is often performed in to steps: first the information bearing signal is modulated onto a carrier with a rather low intermediate frequency (IF)

$$s_{IF}(t) = s_I(t)\cos\omega_{IF}t - s_Q(t)\sin\omega_{IF}t.$$

then the IF-signal is converted to RF using a mixer and a second local oscillator with frequency $f_{RF} - f_{IF}$.

Figure 5:
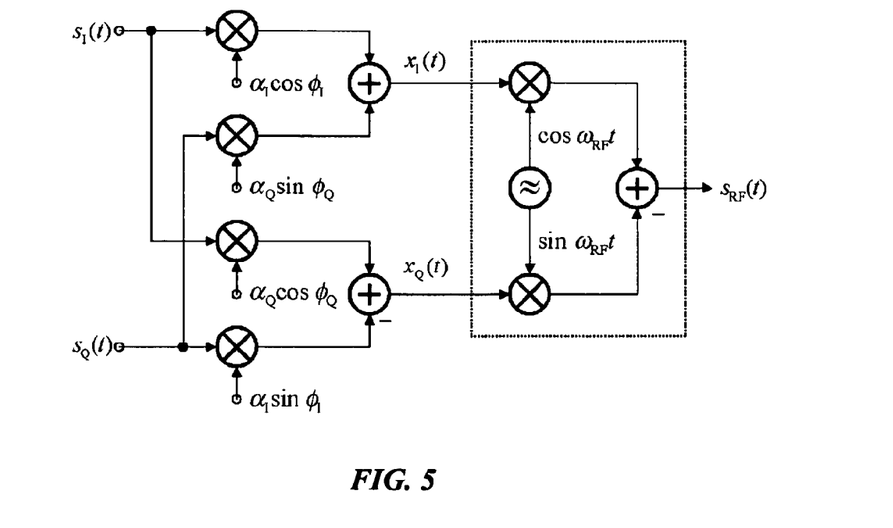
FIG. 5 is a diagram illustrating unbalanced, "real-life" modulator.

However in practice it is impossible to build perfectly balanced modulator and FIG. 5 illustrates such "real life" (unbalanced) modulator.

The unbalanced modulator, as shown in FIG. 5 can be described as $$\begin{aligned}x_{RF}(t) &= \alpha_I s_I(t)\cos(\omega_{RF}t - \phi_I) - \alpha_Q s_Q(t)\sin(\omega_{RF}t - \phi_Q)\\&= \alpha_I s_I(t)(\cos\omega_{RF}t\cos\phi_I + \sin\omega_{RF}t\sin\phi_I) -\\&\quad \alpha_Q s_Q(t)(\sin\omega_{RF}t\cos\phi_Q - \cos\omega_{RF}t\sin\phi_Q)\\&= [\alpha_I\cos\phi_I s_I(t) + \alpha_Q s_Q(t)\sin\phi_Q]\cos\omega_{RF}t -\\&\quad [\alpha_Q\cos\phi_Q s_Q(t) + \alpha_I s_I(t)\sin\phi_I]\sin\omega_{RF}t.\end{aligned}$$

where $\alpha_I$ and $\alpha_Q$ describe the amplitude imbalances, $\phi_I$ and $\phi_Q$ describe the phase imbalances. With the abbreviations $$x_I(t) = \alpha_I\cos\phi_I s_I(t) + \alpha_Q\sin\phi_Q s_Q(t),$$

$$x_Q(t) = \alpha_Q\cos\phi_Q s_Q(t) - \alpha_I\sin\phi_I s_I(t),$$

we get $$x_{RF}(t) = x_I(t)\cos\omega_{RF}t - x_Q(t)\sin\omega_{RF}t.$$

The complex valued signal $s(t) = s_I(t) + js_Q(t)$ is transformed into the signal $x(t) = x_I(t) + jx_Q(t)$. Then, x(t) is input to a perfectly balanced modulator.

Since only the differences between the amplitudes and phases, respectively, are of interest, one of the amplitudes and one of the phases can be chosen arbitrarily. Let e.g.

$$\phi_I = 0,$$

$$\alpha_Q = \frac{1}{\cos\phi_Q}.$$

Then we get $$x_I(t) = \alpha_I s_I(t) + \tan\phi_Q s_Q(t),$$

$$x_Q(t) = s_Q(t).$$

This means, only the real part of the signal is affected by the imbalances. If we choose $$\phi_Q = 0,$$

$$\alpha_I = \frac{1}{\cos\phi_I},$$

then $$x_I(t) = s_I(t),$$

$$x_Q(t) = \alpha_Q s_Q(t) - \tan\phi_I s_I(t),$$

i.e., only the imaginary part of the signal is affected by the imbalances.

Amplifier

Let $$x_{RF}(t) = x_I(t)\cos\omega_{RF}t - x_Q(t)\sin\omega_{RF}t$$

be the input to the amplifier and $$y_{RF}(t) = y_I(t)\cos\omega_{RF}t - y_Q(t)\sin\omega_{RF}t$$

be the output of the amplifier. Ideal amplification means that the input is multiplied by a constant factor g>1 and, possibly, the carrier-phase is shifted by a constant value, $\phi$. Then $$y_{RF}(t) = gx_I(t)\cos(\omega_{RF}t + \phi) - gx_Q(t)\sin(\omega_{RF}t + \phi)$$
$$= gx_I(t)[\cos\omega_{RF}t\cos\phi - \sin\omega_{RF}t\sin\phi] -$$
$$gx_Q(t)[\sin\omega_{RF}t\cos\phi + \cos\omega_{RF}t\sin\phi]$$
$$= [g\cos\phi x_I(t) - g\sin\phi x_Q(t)]\cos\omega_{RF}t -$$
$$[g\sin\phi x_I(t) + g\cos\phi x_Q(t)]\sin\omega_{RF}t$$
$$= [g_I x_I(t) - g_Q x_Q(t)]\cos\omega_{RF}t - [g_Q x_I(t) + g_I x_Q(t)]\sin\omega_{RF}t,$$

where $$g_I = g\cos\phi,$$
$$g_Q = g\sin\phi.$$

This implies $$y_I(t) = g_I x_I(t) - g_Q x_Q(t),$$
$$y_Q(t) = g_Q x_I(t) + g_I x_Q(t).$$

Let $x(t) = x_I(t) + jx_Q(t)$, $y(t) = y_I(t) + jy_Q(t)$ and $g = g_I + jg_Q$, then $$y(t) = gx(t).$$

In baseband-notation the output-signal of an ideal amplifier is just the input signal multiplied by a complex factor g. The gain is $$|g| = \sqrt{g_I^2 + g_Q^2},$$

the phase shift of the carrier is $$\phi = \arctan\frac{g_Q}{g_I}.$$

If the amplifier is non-ideal, then the gain g somehow depends on the input signal. Usually it is assumed, that the amplifier is memoryless, i.e. g depends only on the present value of the input signal, x(t), and is independent of past values ($x(\tau)$, $\tau < t$). Further it can be assumed, that g depends only on the absolute value of x(t). A phase shift of the input signal is equivalent to a time shift of the carrier. This results in an identical time shift of the carrier of output signal, i.e. in an identical phase shift of the output signal. This has no influence on the complex gain. In baseband-notation we get $$y(t) = g(|x(t)|)x(t).$$

Since the function g is only defined for positive valued arguments, it can be completed arbitrarily for negative valued arguments. Let $g(-|x(t)|) = g(|x(t)|)$; further, assume that g can be developed in a Taylor-series, then $$g(|x(t)|) = \sum_{k=0}^{\infty} b_k |x(t)|^{2k}.$$

Thus, $$y(t) = \sum_{k=0}^{\infty} b_k |x(t)|^{2k} x(t).$$

This series contains only odd powers of x(t). Usually, this is reflected by substituting $b_k$ by $a_{2k+1}$:

$$y(t) = \sum_{k=0}^{\infty} a_{2k+1} |x(t)|^{2k} x(t).$$

Adaptive Wiener-Filter

Figure 6:
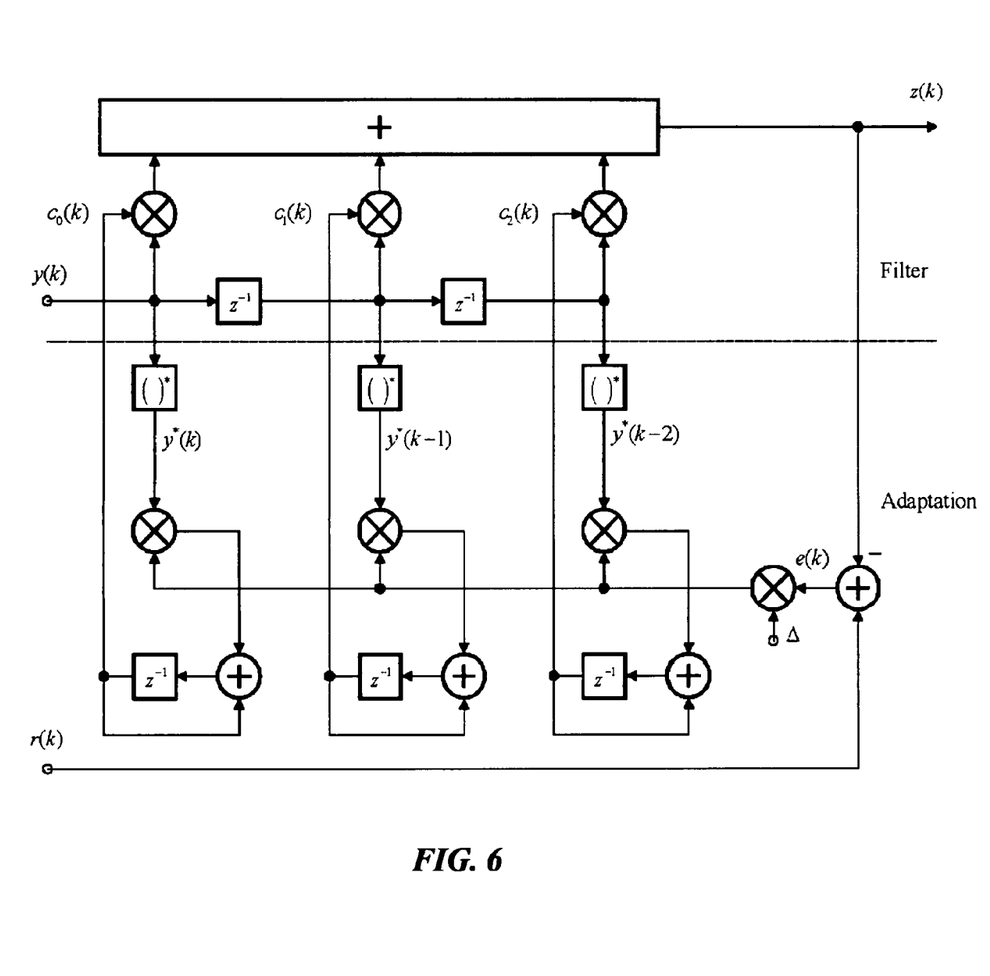
FIG. 6 is a diagram illustrating adaptive Wiener filter implemented in one embodiment of the present invention.

FIG. 6 shows the diagram of an adaptive Wiener-filter having 3 filter-coefficients. Generally, the filter has L coefficients, which, due to the adaptation may vary from clock cycle to clock cycle. Let $c_l(k)$ denote the l-th coefficient in the k-th clock cycle. The filter-coefficients are complex valued as well as all signals. Let y(k) be the input in the k-th clock cycle, and z(k) the output. Then $$z(k) = \sum_{l=0}^{L-1} c_l(k) y(k-l).$$

r(k) denotes the information bearing signal in the k-th clock cycle. The error signal is defined as $$e(k) = r(k) - z(k).$$

The coefficients are recursively updated according to the gradient algorithm (see e.g. J. G. Proakis, Digital Communications, McGraw-Hill, 1983)

$$c_l(k+1) = c_l(k) + \Delta e(k) r^*(k-l).$$

$r^*$ is the conjugate of r. $\Delta$ is a constant which controls the convergence behaviour of the algorithm. It can be shown, that this adaptation algorithm results in a filter that minimises the mean square error between z(k) and r(k). With $e(k) = e_I(k) + je_Q(k)$ we get $$c_l(k+1) = c_l(k) + \Delta e_I(k) r^*(k-l) + j\Delta e_Q(k) r^*(k-l).$$

This offers two possibilities to modify the recursion:
1. If the real part of the error signal is neglected, then $$c_l(k+1) = c_l(k) + j\Delta e_Q(k) r^*(k-l).$$

This results in a filter that minimises the mean square error between the imaginary parts of z(k) and r(k). Since the real part has no influence, this recursion is to be preferred, if the modulator in the transmitter is modelled such that the imbalances only influence the real part of the signal.

2. If the imaginary part of the error signal is neglected, then $$c_l(k+1) = c_l(k) + \Delta e_I(k) r^*(k-l).$$

This results in a filter that minimises the mean square error between the real parts of z(k) and r(k). Since the real imaginary has no influence, this recursion is to be preferred, if the modulator in the transmitter is modelled such that the imbalances only influence the imaginary part of the signal.

The coefficients of the Wiener-filter are adjustable. The purpose of the filtering is first to time-synchronize the received signal to the reference signal, and, second, to remove linear distortions from the received filter. Linear distortions arise from an analogue filter prior to the analogue-to-digital conversion. Such a filter is generally necessary to suppress out of band noise. The transfer function of the Wiener-filter then is nearly the inverse of the transfer function of that analogue filter.

Amplifier Non-Linearity and Wiener-Filter

Let assume, the amplifier gain can be described as a finite polynomial instead of an infinite Taylor-series. Then $$y(t) = \sum_{k=0}^{K-1} a_{2k+1} |x(t)|^{2k} x(t).$$

To simplify the notation, let $$\xi_k(t) = |x(t)|^{2k} x(t).$$

Then $$y(t) = \sum_{k=0}^{K-1} a_{2k+1} \xi_k(t).$$

Therefore, $$E[\xi_n^*(t)y(t+\tau)] = \sum_{k=0}^{K-1} a_{2k+1} E[\xi_n^*(t)\xi_k(t+\tau)],$$

$$n \in \{0, \ldots, K-1\}.$$

E[x] denotes the expectation of the random number x. Assume, that all signal processes are stationary. Then the expectations are independent of t and we can define the correlation functions $$\phi_{\xi_n y}(\tau) = E[\xi_n^*(t)y(t+\tau)],$$

$$\phi_{\xi_n \xi_k}(\tau) = E[\xi_n^*(t)\xi_k(t+\tau)].$$

This gives $$\phi_{\xi_n y}(\tau) = \sum_{k=0}^{K-1} a_{2k+1} \phi_{\xi_n \xi_k}(\tau),$$

$$n \in \{0, \ldots, K-1\}.$$

Applying Fourier-transformation gives the spectra $$\Phi_{\xi_n y}(f) = \sum_{k=0}^{K-1} a_{2k+1} \Phi_{\xi_n \xi_k}(f),$$

$$n \in \{0, \ldots, K-1\}.$$

This is a system of K independent equations for K unknown variables $a_{2k+1}$. It is important to notice, that these spectra only need to be evaluated at one particular frequency f.

Now let h(t) be the impulse response of an arbitrary filter and let η(t) be the output of that filter, when y(t) is the input:

$$\eta(t) = \int_0^\infty h(\tau) y(t-\tau) d\tau.$$

Then $$\Phi_{\xi_n \eta}(f) = H(f) \Phi_{\xi_n y}(f), n \in \{0, \ldots, K-1\}.$$

That means, $\Phi_{\xi_n \eta}(f)$ can be taken to determine the unknown variables $a_{2k+1}$, as well as $\Phi_{\xi_n y}(f)$. However the evaluation should be carried out using a frequency f, where H(f)=1. It follows, that the non-linearly distorted output-signal at the output of the amplifier can be arbitrarily band-limited. However, linear distortions within the evaluated part of the signal should be eliminated. This can be accomplished by a Wiener-filter as described earlier.

The invention can be implemented in any suitable form including implementation of functionality in hardware, software, firmware or any combination of these. The elements and components of an embodiment of the invention may be physically, functionally and logically implemented in any suitable way. The functionality of each communication device may be implemented in a single unit, in a plurality of units or as part of other functional units.

The invention claimed is:

1. A front-end unit for use in a radio signal transmitter, the front-end unit comprising:
    a mixer operatively connected to a local oscillator;
    an analogue-to-digital converter to process signals received from the mixer;
    a first digital filter for converting signals received from the analogue-to-digital converter to a baseband signal; and
    an adaptive digital filter to time-synchronize its output signal (z(k)) to a reference signal (r(k)), and to remove linear distortions from the baseband signals received from the first digital filter while leaving non-linear distortions unaffected.

2. The front-end unit of claim 1 wherein the mixer and the local oscillator convert an input radio frequency signal ($Y_{RF}$(t)) to an intermediate frequency signal.

3. The front-end unit of claim 1 wherein the first digital filter is a digital Hilbert filter.

4. The front-end unit of claim 1 wherein the adaptive digital filter is an adaptive Wiener filter.

5. The front-end unit of claim 1 wherein the adaptive digital filter connects to an output of a signal source of the radio signal transmitter and uses an output (r(k)) of the signal source as the reference signal.

6. The front-end unit of claim 5 wherein the adaptive digital filter has a set of coefficients defining its transfer function, and wherein the adaptive digital filter minimizes a mean square error between the output signal (z(k)) of the adaptive digital filter and the reference signal (r(k)) received from the signal source.

7. A transmitter for transmitting radio signals, the transmitter comprising:
    a digital signal source;
    a compensation unit;
    two digital-to-analogue converters;
    an analogue modulator;
    an amplifier;
    an antenna connected to the amplifier; and a front-end unit connected to an estimator, the front-end unit comprising:
  a mixer operatively connected to a local oscillator;
  an analogue-to-digital converter to process signals received from the mixer;
  a first digital filter to convert signals received from the analogue-to-digital converter to baseband signals; and
  an adaptive digital filter to time-synchronize its output signal (z(k)) to a reference signal (r(k)), and to remove linear distortions from the baseband signals received from the first digital filter while leaving non-linear distortions unaffected.

8. The transmitter of claim 7 wherein the mixer and the local oscillator convert an input radio frequency signal to an intermediate frequency signal.

9. The transmitter of claim 7 wherein the first digital filter is a digital Hilbert filter.

10. The transmitter of claim 7 wherein the adaptive digital filter is an adaptive Wiener filter.

11. The transmitter of claim 7 wherein the adaptive digital filter connects to an output of a signal source of a radio signal transmitter, and uses an output of the signal source as the reference signal.

12. The transmitter of claim 11 wherein the adaptive digital filter has a set of coefficients defining its transfer function, and wherein the adaptive digital filter minimizes a mean square error between the output signal of the adaptive digital filter and the reference signal received from the signal source.

13. A transceiver for transmitting and receiving radio signals comprising:
  a receiving section; and
  a transmitting section comprising:
    a digital signal source;
    a compensation unit;
    two digital-to-analogue converters;
    an analogue modulator;
    an amplifier;
    an antenna connected to the amplifier; and
    a front-end unit connected to an estimator, the front-end unit comprising:
      a mixer operatively connected to a local oscillator;
      an analogue-to-digital converter to process signals received from the mixer;
      a first digital filter for converting signals received from the analogue-to-digital converter to baseband signals; and
      an adaptive digital filter time-synchronize its output signal (z(k)) to a reference signal (r(k)), and to remove linear distortions from the baseband signals received from the first digital filter while leaving non-linear distortions unaffected.

14. The transceiver of claim 13 wherein the mixer and the local oscillator are adapted to convert an input radio frequency signal to an intermediate frequency signal.

15. The transceiver of claim 13 wherein the first digital filter is a digital Hilbert filter.

16. The transceiver of claim 13 wherein the adaptive digital filter is an adaptive Wiener filter.

17. The transceiver of claim 13 wherein the adaptive digital filter connects to an output of a signal source of a radio signal transmitter and uses an output of the signal source as the reference signal.

18. The transceiver of claim 17 wherein the adaptive digital filter has a set of coefficients defining its transfer function, and wherein the adaptive digital filter minimizes a mean square error between the output signal of the adaptive digital filter and the reference signal received from the signal source.

19. A method of monitoring non-linear distortions of radio signals transmitted by a radio signal transmitter comprising:
  converting radio a frequency input signal to an intermediate frequency analogue signal;
  converting the intermediate frequency analogue signal to an intermediate frequency digital signal;
  converting the intermediate frequency digital signal to a baseband digital signal;
  time-synchronizing an output signal of an adaptive digital filter that receives the baseband signal to a reference signal; and
  removing linear distortions from the baseband signal while leaving non-linear distortions unaffected.

20. The method of claim 19 wherein a portion of an output signal of the radio signal transmitter is used as the radio frequency input signal.

21. The method of claim 19 wherein an output of a signal source of a radio signal transmitter is used as the reference signal to time-synchronize the output signal of the adaptive digital filter.

22. The method of claim of claim 21 wherein in the time-synchronizing and removing steps, the adaptive digital filter has a transfer function defined by a set of coefficients to minimize a mean square error between the output signal of the adaptive digital filter and the reference signal received from the signal source.

\* \* \* \* \*

UNITED STATES PATENT AND TRADEMARK OFFICE
CERTIFICATE OF CORRECTION

| | |
|---|---|
| PATENT NO. | : 7,812,748 B2 |
| APPLICATION NO. | : 12/301909 |
| DATED | : October 12, 2010 |
| INVENTOR(S) | : Hagmanns |

It is certified that error appears in the above-identified patent and that said Letters Patent is hereby corrected as shown below:

On the Title Page, item (57), under "ABSTRACT", in Column 2, Line 3, delete "digit al" and insert -- digital --, therefor.

In Column 3, Line 10, delete "art," and insert -- art; --, therefor.

In Column 3, Line 63, delete "neccessary" and insert -- necessary --, therefor.

In Column 7, Line 55, delete "$y(t)=g(|x(t)|)x(t)$." and insert -- $y(t)=g(|x(t)|)x(t)$. --, therefor.

In Column 10, Line 13, delete "$a_{2k+1}$," and insert -- $a_{2k+1}$ --, therefor.

In Column 10, Lines 43-44, in Claim 2, delete "$(Y_{RF}(t))$" and insert -- $(y_{RF}(t))$ --, therefor.

In Column 12, Line 42, in Claim 22, delete "of claim of claim" and insert -- of claim --, therefor.

Signed and Sealed this
First Day of November, 2011

David J. Kappos
*Director of the United States Patent and Trademark Office*